US009229162B1

(12) United States Patent
Roper et al.

(10) Patent No.: US 9,229,162 B1
(45) Date of Patent: *Jan. 5, 2016

(54) THREE-DIMENSIONAL ORDERED DIAMOND CELLULAR STRUCTURES AND METHOD OF MAKING THE SAME

(75) Inventors: Christopher S. Roper, Pacific Palisades, CA (US); William B. Carter, Calabasas, CA (US); Alan J. Jacobsen, Woodland Hills, CA (US); Tobias Schaedler, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 10 days.

This patent is subject to a terminal disclaimer.

(21) Appl. No.: 13/017,704

(22) Filed: Jan. 31, 2011

(51) Int. Cl.
| | |
|---|---|
| *G02B 6/12* | (2006.01) |
| *G02B 6/138* | (2006.01) |
| *G02B 6/122* | (2006.01) |
| *C23C 16/27* | (2006.01) |
| *C23C 16/06* | (2006.01) |
| *C23C 16/30* | (2006.01) |
| *B29C 67/20* | (2006.01) |
| *B29C 41/02* | (2006.01) |
| *B82Y 20/00* | (2011.01) |
| *B29C 35/08* | (2006.01) |

(52) U.S. Cl.
CPC ......... *G02B 6/12002* (2013.01); *B29C 41/025* (2013.01); *B29C 67/20* (2013.01); *C23C 16/06* (2013.01); *C23C 16/27* (2013.01); *C23C 16/30* (2013.01); *G02B 6/1221* (2013.01); *G02B 6/138* (2013.01); *B29C 2035/0827* (2013.01); *B82Y 20/00* (2013.01); *G02B 2006/1219* (2013.01); *Y10T 428/249978* (2015.04); *Y10T 428/249987* (2015.04)

(58) Field of Classification Search
CPC .. G02B 6/1221; G02B 6/138; G02B 6/12002; G02B 2006/1219; B82Y 20/00; C23C 16/27; C23C 16/06; C23C 16/30; B29C 67/20; B29C 41/025; B29C 2035/0827; Y10T 428/249978; Y10T 428/249987
USPC ............................................. 428/306.6, 309.9
See application file for complete search history.

(56) References Cited

U.S. PATENT DOCUMENTS

| | | | |
|---|---|---|---|
| 3,446,593 A | 5/1969 | Moutaud et al. | |
| 3,820,596 A | 6/1974 | Weinhardt et al. | |
| 3,834,457 A | 9/1974 | Madsen | |
| 3,984,861 A | 10/1976 | Kessler, Jr. | |
| 4,022,875 A | 5/1977 | Vinton et al. | |
| 5,674,572 A * | 10/1997 | Sarin et al. | 427/450 |

(Continued)

FOREIGN PATENT DOCUMENTS

| | | | |
|---|---|---|---|
| WO | WO 8304408 A1 * | 12/1983 | |
| WO | 01/92001 A1 | 12/2001 | |
| WO | 02/06747 A1 | 1/2002 | |

OTHER PUBLICATIONS

Kishner, et al., Large stable mirrors: a comparison of glass, beryllium and silicon carbide, 1990, pp. 127-139, SPIE vol. 1335, Dimensional Stability.

(Continued)

*Primary Examiner* — Hai Vo
(74) *Attorney, Agent, or Firm* — Christopher R. Balzan

(57) ABSTRACT

Various implementations and embodiments relate to three-dimensional open cellular diamond micro-truss structures and methods.

13 Claims, 6 Drawing Sheets

(56) References Cited

U.S. PATENT DOCUMENTS

| | | | |
|---|---|---|---|
| 6,274,288 B1 | 8/2001 | Kewitsch et al. | |
| 6,749,931 B1 | 6/2004 | Pinneo et al. | |
| 6,815,052 B2 | 11/2004 | Pinneo | |
| 6,987,318 B2* | 1/2006 | Sung | 257/720 |
| 7,382,959 B1 | 6/2008 | Jacobsen | |
| 7,401,643 B2* | 7/2008 | Queheillalt et al. | 165/104.21 |
| 7,653,276 B1 | 1/2010 | Gross et al. | |
| 7,653,279 B1 | 1/2010 | Jacobsen | |
| 7,687,132 B1 | 3/2010 | Gross et al. | |
| 8,114,544 B1* | 2/2012 | Salguero et al. | 429/401 |
| 8,155,496 B1* | 4/2012 | Cumberland et al. | 385/147 |
| 8,195,023 B1 | 6/2012 | Jacobsen et al. | |
| 8,197,930 B1* | 6/2012 | Jacobsen et al. | 428/315.5 |
| 8,247,333 B2 | 8/2012 | Sypeck et al. | |
| 8,272,309 B1* | 9/2012 | Cumberland et al. | 89/36.02 |
| 8,320,727 B1 | 11/2012 | Jacobsen et al. | |
| 8,353,240 B1* | 1/2013 | Schaedler et al. | 89/36.02 |
| 8,435,438 B1 | 5/2013 | Gross et al. | |
| 8,453,717 B1* | 6/2013 | Roper et al. | 165/80.4 |
| 8,573,289 B1* | 11/2013 | Roper et al. | 165/164 |
| 8,579,018 B1* | 11/2013 | Roper et al. | 165/104.26 |
| 8,585,944 B1 | 11/2013 | Jacobsen | |
| 8,921,702 B1 | 12/2014 | Carter et al. | |
| 9,086,229 B1 | 7/2015 | Roper et al. | |
| 2004/0136101 A1 | 7/2004 | Warren | |
| 2006/0181794 A1 | 8/2006 | Warren | |
| 2007/0036896 A1* | 2/2007 | Sung et al. | 427/249.8 |
| 2007/0068654 A1 | 3/2007 | Chang | |
| 2007/0234894 A1* | 10/2007 | Lucuta et al. | 89/36.02 |
| 2010/0155033 A1 | 6/2010 | Holley et al. | |

OTHER PUBLICATIONS

Fortini, Arthur J., Open-cell foam for ultralightweight mirrors, SPIE Conference an Optomechanical Design and Enoineering. Jul. 1999, pp. 440-446, SPIE vol. 3786, Denver, Colorado.

Jacobsen, et al., U.S. Appl. No. 12/317,210, Title: Functionally-Graded Three Dimensiional Ordered Open-Cellular Microstructure and Metod of Making Same, filed Dec. 18, 2008.

Jacobsen, et al., U.S. Appl. No. 12/008,479, Title: Composite Structures with Ordered Three Dimensional (3D) Continuous Interpenetrating Phases, filed Jan. 11, 2008.

Jacobsen, U.S. Appl. No. 11/870,379, Title: Ordered Open-Cellular Carbon Microstructure and Method of Making Same, filed Oct. 10, 2007.

Jacobsen et al., U.S. Appl. No. 11/801,908, Title: Three-Dimensional Ordered Open-Cellular Structures, filed May 10, 2007.

Jacobsen et al., U.S. Appl. No. 12/455,449, Title: Micro-Truss Based Energy Absorption Apparatus, filed Jun. 1, 2009.

Cumberland et al., U.S. Appl. No. 12/476,201 Title: Composite Truss Armor, filed Jun. 1, 2009.

Zhou et al., U.S. Appl. No. 12/506,859, Title: Pre-Ceramic Monomer Formulations for Making Preceramic Polymer Waveguides, filed Jul. 21, 2009.

Wadley, H.N.G., et al., Fabrication and structural performance of periodic cellular metal sandwich structures, Composites Science and Technology 63, 2003, p. 2331-2343.

Gross et al., U.S. Appl. No. 12/705,534, Title: Ceramic Microtruss, filed Feb. 12, 2010.

Evans, A.G., Lightweight Materials and Structures, MRS Bulletin, (www.mrs.org/publications/bulletin) Oct. 2001, p. 790-797.

Evans, A.G., et al, Multifunctionality of cellular metal systems, Progress in Materials Science 43, 1999, p. 171-221.

Christopher S. Roper, et al., U.S. Appl. No. 13/300,543, Title: Optical components from micro-architected trusses, filed Nov. 18, 2011.

USPTO Non Final Office Action (NFOA01) mailed Jun. 14, 2013 for U.S. Appl. No. 13/300,543, Title: Optical components from micro-architected trusses; filed Nov. 18, 2011 by Christopher S. Roper et al.

Response to USPTO Non Final Office Action (R-NFOA01) mailed Jun. 14, 2013 filed Sep. 16, 2013 for U.S. Appl. No. 13/300,543, Title: Optical components from micro-architected trusses; filed Nov. 18, 2011 by Christopher S. Roper et al.

USPTO Non Final Office Action (NFOA02) mailed Nov. 13, 2013 for U.S. Appl. No. 13/300,543, Title: Optical components from micro-architected trusses; filed Nov. 18, 2011 by Christopher S. Roper et al.

Response to USPTO Non Final Office Action (R-NFOA02) mailed Nov. 13, 2013 filed Apr. 14, 2014 for U.S. Appl. No. 13/300,543, Title: Optical components from micro-architected trusses; filed Nov. 18, 2011 by Christopher S. Roper et al.

William B. Carter, et al., U.S. Appl. No. 12/691,393, Title: Microtruss based thermal heat spreading structures filed Jan. 21, 2010.

USPTO Non Final Office Action (NFOA01) mailed Jul. 3, 2013 for U.S. Appl. No. 12/691,393, Title: Microtruss based thermal heat spreading structures filed Jan. 21, 2010 by William B. Carter, et al.

Response to USPTO Non Final Office Action (R-NFOA01) mailed Jul. 3, 2013 filed Oct. 3, 2013 for U.S. Appl. No. 12/691,393, Title: Microtruss based thermal heat spreading structures filed Jan. 21, 2010 by William B. Carter, et al.

USPTO Final Office Action (FOA) mailed Feb. 5, 2014 for U.S. Appl. No. 12/691,393, Title: Microtruss based thermal heat spreading structures filed Jan. 21, 2010 by William B. Carter, et al.

Response to USPTO Final Office Action (R-FOA) mailed Feb. 5, 2014 filed May 5, 2014 for U.S. Appl. No. 12/691,393, Title: Microtruss based thermal heat spreading structures filed Jan. 21, 2010 by William B. Carter, et al.

William B. Carter, et al., U.S. Appl. No. 12/691,322, Title: Microtruss based thermal plane structures and microelectronics and printed wiring board embodiments filed Jan. 21, 2010.

USPTO Non Final Office Action (NFOA01) mailed Feb. 17, 2012 for U.S. Appl. No. 12/691,322, Title: Microtruss based thermal plane structures and microelectronics and printed wiring board embodiments filed Jan. 21, 2010 by William B. Carter, et al.

Response to USPTO Non Final Office Action (R-NFOA01) mailed Feb. 17, 2012 filed Jul. 17, 2012 for U.S. Appl. No. 12/691,322, Title: Microtruss based thermal plane structures and microelectronics and printed wiring board embodiments filed Jan. 21, 2010 by William B. Carter, et al.

USPTO Final Office Action (FOA) mailed Aug. 3, 2012 for U.S. Appl. No. 12/691,322, Title: Microtruss based thermal plane structures and microelectronics and printed wiring board embodiments filed Jan. 21, 2010 by William B. Carter, et al.

Response to USPTO Final Office Action (R-FOA) mailed Aug. 3, 2012 filed Dec. 3, 2012 for U.S. Appl. No. 12/691,322, Title: Microtruss based thermal plane structures and microelectronics and printed wiring board embodiments filed Jan. 21, 2010 by William B. Carter, et al.

USPTO Applicant Initiated Interview Summary (INT-SUM) mailed Dec. 6, 2012 for U.S. Appl. No. 12/691,322, Title: Microtruss based thermal plane structures and microelectronics and printed wiring board embodiments filed Jan. 21, 2010 by William B. Carter, et al.

USPTO Non Final Office Action (NFOA02) mailed Jan. 17, 2013 for U.S. Appl. No. 12/691,322, Title: Microtruss based thermal plane structures and microelectronics and printed wiring board embodiments filed Jan. 21, 2010 by William B. Carter, et al.

Response to USPTO Non Final Office Action (R-NFOA02) mailed Jan. 17, 2013 filed Jun. 17, 2013 for U.S. Appl. No. 12/691,322, Title: Microtruss based thermal plane structures and microelectronics and printed wiring board embodiments filed Jan. 21, 2010 by William B. Carter, et al.

USPTO Final Office Action (FOA01) mailed Jul. 9, 2013 for U.S. Appl. No. 12/691,322, Title: Microtruss based thermal plane structures and microelectronics and printed wiring board embodiments filed Jan. 21, 2010 by William B. Carter, et al.

Response to USPTO Final Office Action (R-FOA01) mailed Jul. 9, 2013 filed Nov. 12, 2013 for U.S. Appl. No. 12/691,322, Title: Microtruss based thermal plane structures and microelectronics and printed wiring board embodiments filed Jan. 21, 2010 by William B. Carter, et al.

USPTO Final Office Action (FOA02) mailed Nov. 18, 2013 for U.S. Appl. No. 12/691,322, Title: Microtruss based thermal plane structures and microelectronics and printed wiring board embodiments filed Jan. 21, 2010 by William B. Carter, et al.

(56) References Cited

OTHER PUBLICATIONS

Response to USPTO Final Office Action (R-FOA02) mailed Nov. 18, 2013 filed Apr. 18, 2014 for U.S. Appl. No. 12/691,322, Title: Microtruss based thermal plane structures and microelectronics and printed wiring board embodiments filed Jan. 21, 2010 by William B. Carter, et al.

USPTO Notice of Allowance (NOA) mailed May 9, 2014 for U.S. Appl. No. 12/691,322, Title: Microtruss based thermal plane structures and microelectronics and printed wiring board embodiments filed Jan. 21, 2010 by William B. Carter, et al.

USPTO Notice of Allowance (NOA02) mailed Aug. 18, 2014 for U.S. Appl. No. 12/691,322, Title: Microtruss based thermal plane structures and microelectronics and printed wiring board embodiments filed Jan. 21, 2010 by William B. Carter, et al.

USPTO 1.312 Amendment (1_312_Amend) as filed Nov. 14, 2014 for U.S. Appl. No. 12/691,322, Title: Microtruss based thermal plane structures and microelectronics and printed wiring board embodiments filed Jan. 21, 2010 by William B. Carter, et al.

USPTO Non Final Office Action (NFOA) mailed Jun. 4, 2014 for U.S. Appl. No. 12/691,393, Title: Microtruss based thermal heat spreading structures filed Jan. 21, 2010 by William B. Carter, et al.

Response to USPTO Non Final Office Action (R-NFOA) mailed Jun. 4, 2014 filed Oct. 6, 2014 for U.S. Appl. No. 12/691,393, Title: Microtruss based thermal heat spreading structures filed Jan. 21, 2010 by William B. Carter, et al.

USPTO Final Office Action (FOA) mailed Jun. 4, 2014 for U.S. Appl. No. 13/300,543, Title: Optical components from micro-architected trusses; filed Nov. 18, 2011 by Christopher S. Roper et al.

Response to USPTO Final Office Action (R-FOA) mailed Jun. 4, 2014 filed Nov. 4, 2014 for U.S. Appl. No. 13/300,543, Title: Optical components from micro-architected trusses; filed Nov. 18, 2011 by Christopher S. Roper et al.

USPTO Notice of Allowance (NOA01) mailed Nov. 24, 2014 for U.S. Appl. No. 13/300,543, Title: Optical components from micro-architected trusses; filed Nov. 18, 2011 by Christopher S. Roper et al.

USPTO Notice of Allowance (NOA02) mailed Mar. 16, 2015 for U.S. Appl. No. 13/300,543, Title: Optical components from micro-architected trusses; filed Nov. 18, 2011 by Christopher S. Roper et al.

USPTO Final Office Action (FOA) mailed Jan. 21, 2015 for U.S. Appl. No. 12/691,393, Title: Microtruss based thermal heat spreading structures filed Jan. 21, 2010 by William B. Carter, et al.

Response to USPTO Final Office Action (1_114_R-FOA02) mailed Jan. 21, 2015 filed May 21, 2015 for U.S. Appl. No. 12/691,393, Title: Microtruss based thermal heat spreading structures filed Jan. 21, 2010 by William B. Carter, et al.

USPTO Non-Final Office Action (NFOA) mailed Jun. 8, 2015 for U.S. Appl. No. 12/691,393, Title: Microtruss based thermal heat spreading structures filed Jan. 21, 2010 by William B. Carter, et al.

* cited by examiner

THREE-DIMENSIONAL ORDERED DIAMOND CELLULAR STRUCTURES AND METHOD OF MAKING THE SAME

CROSS-REFERENCE TO RELATED APPLICATION(S)

This application is related to the following U.S. Patent Applications, all hereby incorporated by reference in their entireties:

Ser. No. 11/580,335, filed on Oct. 13, 2006 entitled OPTICALLY ORIENTED THREE-DIMENSIONAL POLYMER MICROSTRUCTURES, by Jacobsen, issued as U.S. Pat. No. 7,382,959 on Jun. 3, 2008;

Ser. No. 11/801,908, filed on May 10, 2007 entitled THREE-DIMENSIONAL ORDERED OPEN-CELLULAR STRUCTURES, by Alan J. Jacobsen; and William B. Barvosa-Carter;

Ser. No. 12/074,727, filed Mar. 5, 2008, entitled CERAMIC MICRO-TRUSS, by Adam F. Gross, Alan J. Jacobsen; and Robert Cumberland; and Ser. No. 11/870,379, filed Oct. 10, 2007, entitled ORDERED OPEN-CELLULAR CARBON MICROTRUSS STRUCTURE AND METHOD OF MAKING SAME, by Jacobsen.

BACKGROUND

As the need for high performance materials, such as those used in space optics and the aerospace industry continue to expand, it has become increasingly necessary to introduce new technologies to keep up with growing demands. Current technologies try to facilitate the need for reduced area density of space optic materials, while preserving or increasing the stiffness.

Currently, beryllium has been used in space optics applications because it is known as one of the best specific stiffness materials. However, there have been disadvantages associated with the use of beryllium. Beryllium is known to be toxic and carcinogenic, with short to long term exposure, and can lead to health problems. In addition, fabrication of structures with beryllium can be difficult. In particular, beryllium welding without filler material often is limited to thin foils, which can require high-purity, high-performance beryllium components to be machined. For example, creating a high performance mirror from a sandwich panel structure consisting of two face sheets separated by a core can be difficult when starting with solid beryllium.

Recently, there has been interest in using diamond in structures. Diamond is known to have the highest specific stiffness of any material. However, although these diamond structures exist, they are typically random diamond foams. Disadvantages with these random foam structures typically yield mechanical, thermal and electrical properties which are inferior to materials with an ordered, rationally designed and optimized 3-D microstructure.

Silicon carbide random foams have also been used, but can be disadvantageous. Random cell foams typically have lower stiffness-to mass ratios than micro-architected ordered cellular truss materials. Additionally, silicon carbide typically can have a lower stiffness-to-mass ratio than diamond. Furthermore, silicon carbide can also have a higher thermal distortion parameter (ratio of coefficient of thermal expansion to thermal conductivity) than diamond.

Therefore, while these aforementioned diamond structures can be useful, they are often disadvantageously time consuming to make, typically using pyrolysis, sintering, gas-phase or dip coating processes, which can often require additional steps. Furthermore, structures such as foams, are not ordered microstructures, and can suffer from random interconnections in their forms, thereby reducing the strength of the materials per unit weight. In addition, bulk diamond can be expensive and may not be available in large sizes.

The use of three dimensional (3D) ordered polymer cellular micro-truss materials, allows fabrication of optical components with high stiffness-to-mass ratio. Additionally, lower weight is desirable for uses as aerospace components. These 3D ordered polymer cellular structures have been created using optical interference pattern techniques, also called holographic lithography; however, structures made using these techniques have an ordered structure at the nanometer scale and the structures are limited to the possible interference patterns, as described in Campbell et al., "Fabrication Of Photonic Crystals For The Visible Spectrum By Holographic Lithography," NATURE, Vol. 404, Mar. 2, 2000, which is incorporated by reference herein in its entirety.

Previous works have also been done on creating polymer optical waveguides. A polymer optical waveguide can be formed in certain photopolymers that undergo a refractive index change during the polymerization process. When a monomer that is photo-sensitive is exposed to light (e.g., UV light) under the right conditions, the initial area of polymerization, such as a small circular area, will "trap" the light and guide it to the tip of the polymerized region due to the index of refraction change, further advancing that polymerized region. If the polymer is sufficiently transparent to the wavelength of light used to initiate polymerization, this process will continue, leading to the formation of a waveguide structure, or fiber, with approximately the same cross-sectional dimensions along its entire length. This phenomenon has been suggested for applications, such as fiber optic interconnects, for example. The existing techniques to create polymer optical waveguides have only allowed one or a few waveguides to be formed, and these techniques have not been used to create a self-supporting three-dimensional structure by patterning polymer optical waveguides.

Inorganic polymer materials, such as pre-ceramic polymers have been used to form ceramic micro-truss structures. These pre-ceramic polymers have been used to form specific polymer-based structures that can be subsequently heat treated (pyrolyzed/sintered) to create near net shape ceramic structures.

Advantages of ceramic micro-truss materials include high temperature stability and attractive strength to weight ratios. The importance of these high temperature ceramic micro-truss structures makes these structures amenable to a wide variety of applications, such as the automotive and aerospace industries. These ceramic micro-truss materials could be used for lightweight, high temperature structural applications or for other applications that can utilize the unique porosity, such as thermal ground planes.

Therefore, it is desirable to provide diamond materials with ordered interconnected three-dimensional ceramic microstructures that are lightweight, highly durable, hard materials, and can withstand a high temperature environment. Furthermore, it would be advantageous to use the minimum amount of diamond so that large-scale diamond structures can be fabricated.

SUMMARY

In accordance with various embodiments an ordered three-dimensional open cellular diamond micro-truss structure and a method of making the same are provided.

In one implementation a method of forming an ordered three-dimensional open-cellular diamond micro-truss structure is provided which includes providing an open-cellular polymer template and converting the polymer template to an open-cellular carbon micro-truss structure template. It further includes depositing a film having diamond over the open-cellular carbon micro-truss template to form a coated micro-truss diamond composite structure.

In various implementations, the method may further include applying a diamond-compatible coating to the open-cellular carbon micro-truss structure template with a material to form a coated open-cellular carbon micro-truss template and depositing the film of diamond on the coated open-cellular micro-truss template to form a coated micro-truss-diamond composite structure. The coated micro-truss diamond composite structure is etched with an effective etchant under conditions to etch the diamond-compatible coating from the coated micro-truss diamond composite structure, to create an ordered three-dimensional open-cellular diamond micro-truss structure.

In some implementations, the open-cellular polymer template may be formed from an interconnected pattern of self-propagating waveguides.

In various implementations, the diamond-compatible coating may be a material such as refractory metals, ceramics, silicon carbide, silicon nitride, hafnium carbide, chromium carbide, boron nitride, boron carbide, aluminum oxide, titanium diboride, titanium nitride, zirconium dioxide, titanium carbide, titanium carbonitride, tantalum carbide and tantalum nitride.

In various implementations, the film having diamond may be deposited by a gas phase deposition technique such as hot wire chemical vapor deposition (HWCVD), plasma enhanced chemical vapor deposition (PECVD), or microwave-assisted chemical vapor deposition.

In various embodiments, the deposited diamond may be monocrystalline, polycrystalline, nanocrystalline, or amorphous.

In some implementations, the effective etchant may be a molten salt selected from the group consisting of potassium hydroxide (KOH), sodium hydroxide (NaOH), potassium nitrate ($KNO_3$), sodium oxide ($Na_2O_2$) and sodium nitrate ($NaNO_3$), and mixtures thereof.

In one implementation, a method of forming an ordered three-dimensional open cellular diamond micro-truss structure is provided which includes providing an open-cellular polymer template, converting the polymer template to a vitreous carbon template, and applying a silicon carbide coating to the vitreous carbon template to form a silicon carbide template. A film having diamond is deposited on the silicon carbide template to form a silicon carbide-diamond composite structure. The silicon carbide-diamond composite structure may be etched with an effective etchant under conditions to etch the silicon carbide coating to create an ordered three-dimensional diamond micro-truss structure.

In some embodiments, the three-dimensional diamond micro-truss structure may include a network of hollow tubes made of diamond. The network of hollow tubes may have bi-layer walls of diamond. The network of hollow tubes may further include silicon carbide.

In another embodiment of the present invention, a three-dimensional diamond micro-truss structure is provided. The diamond micro-truss structure may include a three-dimensional open-cellular carbon micro-truss structure template with a film having diamond deposited over the micro-truss structure template to create an ordered diamond micro-truss.

The three-dimensional ordered polymer template may be formed from an interconnected pattern of polymer self-propagating waveguides.

In another embodiment, the three-dimensional open-cellular carbon micro-truss structure template may be coated by a material selected from the group consisting of refractory metals, ceramics, silicon carbide, silicon nitride, hafnium carbide, chromium carbide, boron nitride, boron carbide, aluminum oxide, titanium diboride, titanium nitride, zirconium dioxide, titanium carbide, titanium carbonitride, tantalum carbide and tantalum nitride.

In yet another embodiment, the ordered diamond micro-truss may include bi-layer walls of diamond and a material. In some embodiments, the material is selected from the group consisting of refractory metals, ceramics, silicon carbide, silicon nitride, hafnium carbide, chromium carbide, boron nitride, boron carbide, aluminum oxide, titanium diboride, titanium nitride, zirconium dioxide, titanium carbide, titanium carbonitride, tantalum carbide and tantalum nitride.

In yet another embodiment, a diamond sandwich panel is provided. The panel may include two face sheets, and a core. The core may include an ordered three-dimensional open-cellular diamond micro-truss structure disposed between the two face sheets. The face sheets may include diamond. The three-dimensional ordered cellular diamond micro-truss structure may be formed from an interconnected pattern of polymer self-propagating waveguides.

In another embodiment, the three-dimensional ordered cellular diamond micro-truss structure may include bi-layer walls of diamond and a material. In some embodiments the material is selected from the group consisting of refractory metals, ceramics, silicon carbide, silicon nitride, hafnium carbide, chromium carbide, boron nitride, boron carbide, aluminum oxide, titanium diboride, titanium nitride, zirconium dioxide, titanium carbide, titanium carbonitride, tantalum carbide and tantalum nitride.

In a further embodiment, a method of forming a diamond sandwich panel structure is provided. The method includes providing a duct mold; depositing diamond on the internal portion of the duct mold to form diamond face sheets; placing a coated micro-truss composite core structure between the diamond face sheets; depositing diamond on the micro-truss composite core structure and mold to form a coated micro-truss composite core structure; etching the coated micro-truss composite core structure with an effective etchant to etch the coated micro-truss composite core; and removing the duct mold. In some embodiment the etching and removing occur simultaneously.

In one embodiment, a method of forming an ordered three-dimensional open-cellular diamond microtruss structure is provided which includes providing an open-cellular polymer template and depositing a diamond compatible coating directly on the open-cellular polymer template. This embodiment further includes removing the open-cellular polymer template and depositing a diamond comprising material on the diamond compatible coating.

In some embodiments depositing the diamond compatible coating comprises electroplating the open-cellular polymer template.

DESCRIPTION OF THE DRAWINGS

These and other features, aspects, and advantages of the present invention will become better understood with reference to the following description, appended claims, and accompanying drawings where:

DESCRIPTION

Figure 1:
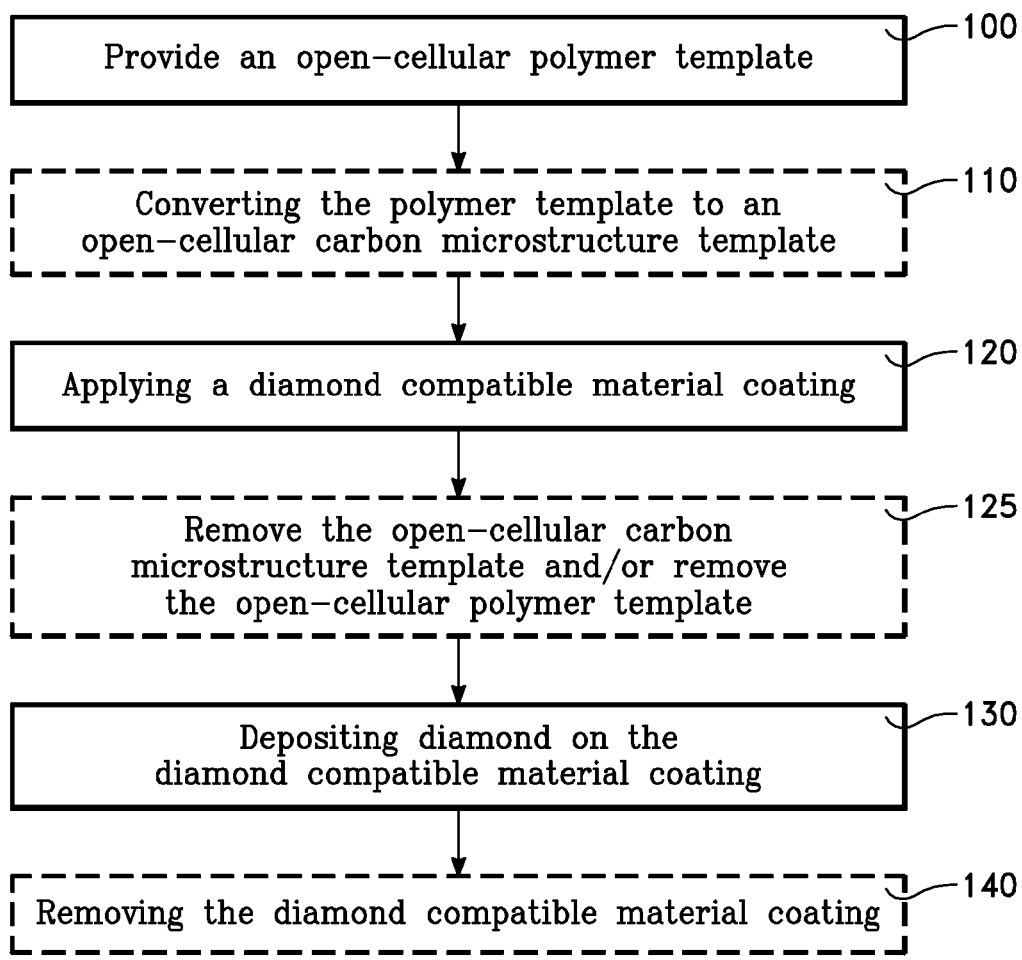
FIG. 1 is a simplified flowchart illustrating a possible implementation for forming an ordered three-dimensional open cellular diamond micro-truss structure.

Referring to FIG. 1, according to one implementation of the present invention, a method for forming an ordered three-dimensional open-cellular diamond micro-truss structure is provided. This method involves providing an open-cellular polymer template 100; converting the polymer template to an open-cellular carbon micro-truss structure template 110; applying a diamond-compatible coating to the open-cellular carbon micro-truss structure template with a material to form a coated open-cellular carbon micro-truss template 120; depositing a film having diamond on the coated open-cellular micro-truss template to form a coated micro-truss-diamond composite structure 130; and etching the coated micro-truss diamond composite structure with an effective etchant under conditions to etch the diamond-compatible coating from the coated micro-truss diamond composite structure, to create an ordered three-dimensional open-cellular diamond micro-truss structure 140.

Figure 2:
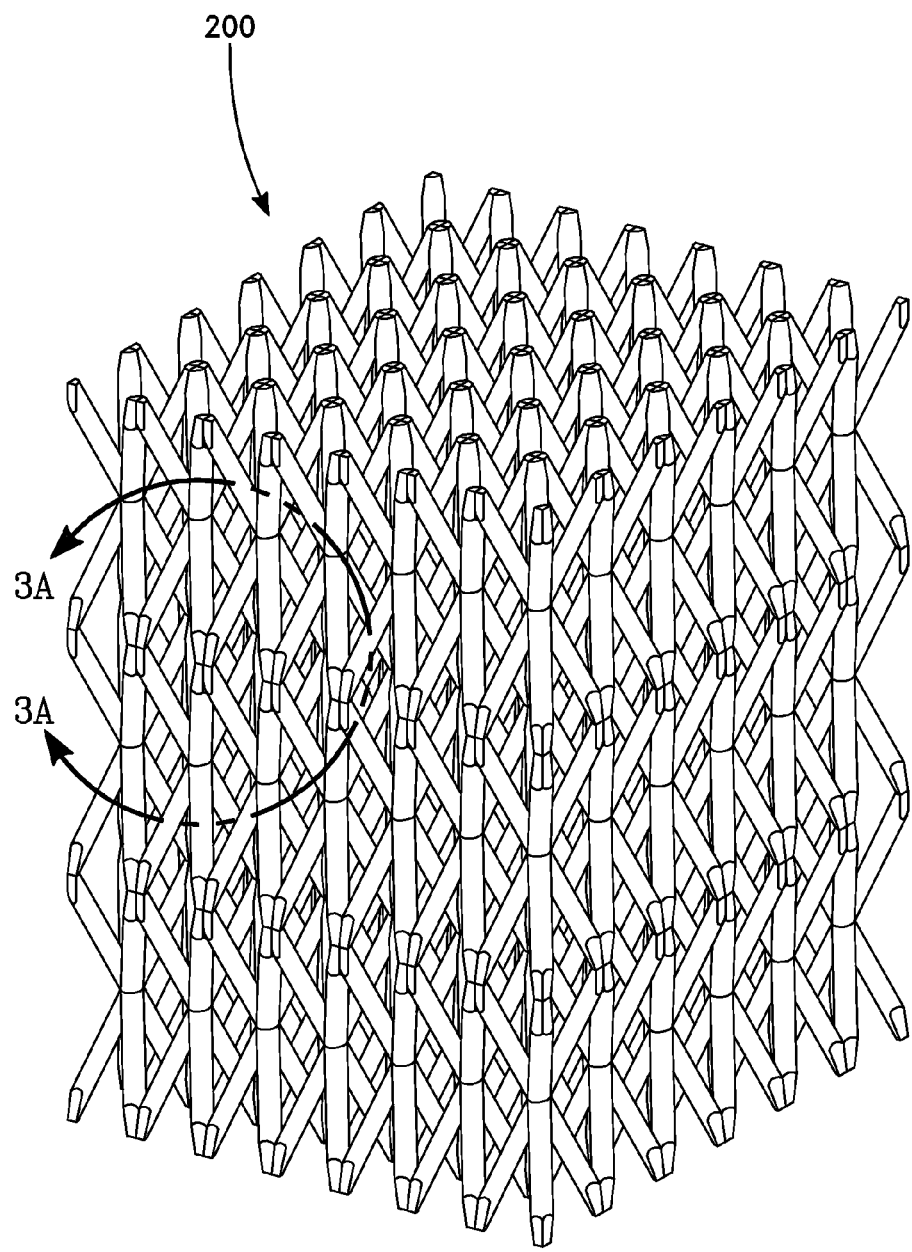
FIG. 2 illustrates an example structure of a three-dimensional open-cellular micro-truss structure.

FIG. 2 illustrates an exemplary structure of a three-dimensional open-cellular micro-truss structure, which is used as a three-dimensional open-cellular polymer template structure in various embodiments of the present invention. In context of embodiments of the present invention, an ordered three-dimensional open-cellular diamond micro-truss structure is referred to as an ordered 3D structure at the micrometer scale.

The open-cellular polymer template 200 of FIG. 1 can be made using the polymers described Ser. No. 11/580,335, filed on Oct. 13, 2006 entitled OPTICALLY ORIENTED THREE-DIMENSIONAL POLYMER MICROSTRUCTURES, by Jacobsen, issued as U.S. Pat. No. 7,382,959 on Jun. 3, 2008, the entire contents of which are incorporated herein by reference. Referring to FIG. 2, this open-cellular polymer template 200, is an ordered three-dimensional polymer micro-truss structure is a self-supporting structure, and is utilized to determine the final shape and dimensions of the ordered three-dimensional open-cellular diamond micro-truss structure.

Typically, the open-cellular polymer template 200 is a near net-shaped polymer template created from an interconnected pattern of self-propagating waveguides as described in the above referenced U.S. Pat. No. 7,382,959. The three-dimensional polymer template 200 includes at least three sets of self-propagating polymer waveguides extending along at least three respective directions. The at least three sets of polymer waveguides interpenetrate each other at a plurality of nodes to form a self-supporting structure having a plurality of ordered interconnected pores. The polymer waveguides typically are fabricated by photopolymerization, suitable for the construction of three dimensional open cellular polymer structures.

Figure 3A:
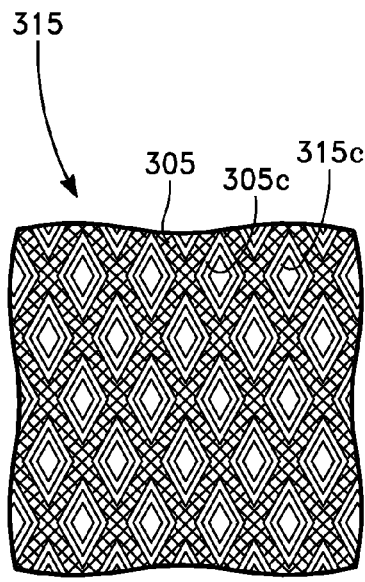
FIGS. 3A-D are simplified cut away cross section illustrations along the 3A-3A line of FIG. 2 illustrating various implementations for forming three dimensional ordered diamond cellular structures.

Turning to FIGS. 3A-D, shown are illustrations of an example implementation of a process for forming various embodiments of a diamond micro-truss structure. FIGS. 3A-D are simplified cut away cross section illustrations taken along the 3A-3A line of FIG. 2. FIG. 3A shows a simplified, enlarged cut away cross section of the open-cellular polymer template 200 of FIG. 2, converted to an open-cellular polymer carbon micro-truss structure template 305. In a possible implementation, the open-cellular polymer carbon micro-truss structure template 305 may be made as described in Ser. No. 11/870,379, filed Oct. 10, 2007, entitled ORDERED OPEN-CELLULAR CARBON MICRO-TRUSS STRUCTURE AND METHOD OF MAKING SAME, by Jacobsen, the entire contents of which are incorporated herein by reference. In accordance with one embodiment, the open-cellular carbon micro-truss structure template 305 typically is a vitreous carbon template. The vitreous carbon template 305 comprises a network of vitreous carbon rods.

Shown in FIG. 3A, a diamond-compatible coating 315$c$ is applied to the open-cellular carbon micro-truss structure template 305 with a material to form a coated open-cellular carbon micro-truss template 315. Possible diamond-compatible coating materials can be used since these materials can withstand the conditions of the diamond deposition process and have a coefficient of thermal expansion well matched to diamond. The diamond-compatible coating can include refractory metals, ceramics, and other materials. The coating may be a material selected from the group consisting of refractory metals, ceramics, silicon carbide, silicon nitride, hafnium carbide, chromium carbide, boron nitride, boron carbide, aluminum oxide, titanium diboride, titanium nitride, zirconium dioxide, titanium carbide, titanium carbonitride, tantalum carbide and tantalum nitride. Typically, the coating is silicon carbide.

Depending on the material selected, the coating 315$c$ can be applied by slurry coating, heat-treatments, chemical vapor deposition (CVD), chemical vapor infiltration (CVI), plasma enhanced chemical vapor deposition (PECVD), microwave assisted chemical vapor deposition and/or other gas phase deposition technique known to those skilled in the art.

According to another embodiment of the present invention, when the vitreous carbon template 305 is coated with silicon carbide 315$c$ to form a silicon carbide template 315, typically, any gas phase deposition technique known to those skilled in the art can be used. The silicon carbide coating 315$c$ can be applied by chemical vapor infiltration (CVI) according to Ser. No. 12/074,727, filed Mar. 5, 2008, entitled CERAMIC MICRO-TRUSS, by Adam F. Gross, Alan J. Jacobsen; and Robert Cumberland, the entire contents of which are incorporated herein by reference.

In some embodiments, the vitreous carbon 305$c$ may be removed after the diamond compatible coating 315$c$ has been applied. The vitreous carbon 305$c$ may be removed or etched by burning out the vitreous carbon 315$c$, e.g. heating in the presence of oxygen or ashing. Such a process or similar process may be used to remove the entire carbon template 305 including the underlying open-cellular polymer template 200 (FIG. 2). If the vitreous carbon 305$c$ is to be removed by burning it out, this should be performed before the diamond coating 325$c$ (FIG. 3B) is applied so that the burning process does not affect/remove the diamond coating 325$c$.

Figure 3B:
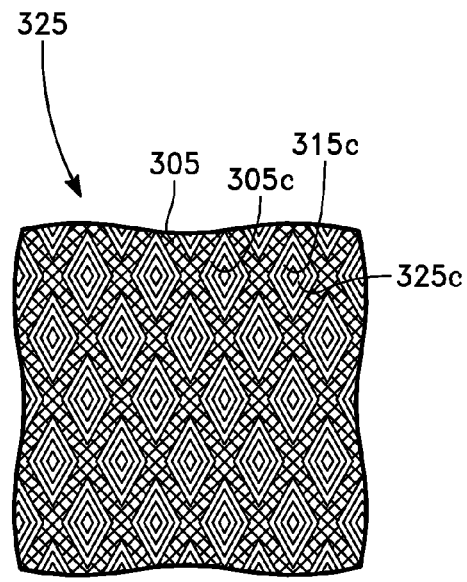

Shown in FIG. 3B, a film or coating of diamond 325$c$ is deposited on the coated open-cellular micro-truss template 315 (FIG. 3A) to form a coated micro-truss-diamond composite structure 325. In accordance with various implementations, the film of diamond 325$c$ may be deposited by any gas phase deposition technique known to those skilled in the art, selected from the group consisting of chemical vapor deposition (CVD), hot wire chemical vapor deposition (HWCVD), plasma enhanced chemical vapor deposition (PECVD) and microwave-assisted chemical vapor deposition. By using such chemical vapor depositions of diamond in an ordered cellular material, the amount of diamond used can be minimized and large-scale diamond structures can be fabricated.

The use of an ordered open cellular material allows optical components to be made of diamond. Diamond typically has the highest specific stiffness of any material; however, bulk diamond can be expensive and not available in large sizes. In an embodiment of the present invention, the diamond may be monocrystalline, polycrystalline, nanocrystalline, or amorphous. The use of an ordered open-cellular material allows the optical components to be made of diamond. Typically, the diamond structure is polycrystalline, since it is known to those skilled in the art that larger grains lead to higher thermal conductivity, which can lead to lowed thermal distortion.

In an embodiment of the present invention, a film of polycrystalline, nanocrystalline, or amorphous diamond can be deposited on the silicon carbide template 315 (FIG. 3A) to form a silicon carbide-diamond composite structure 325 using hot wire chemical vapor deposition (HWCVD).

Figure 3C:
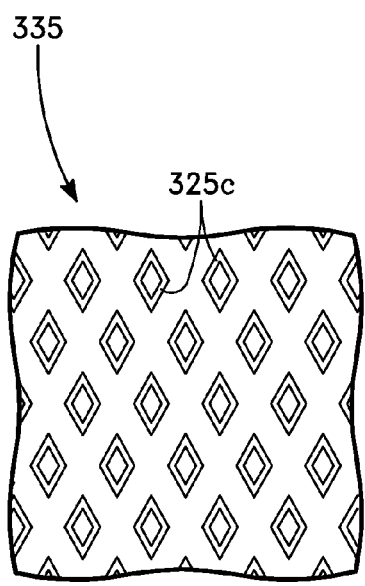
Figure 3D:
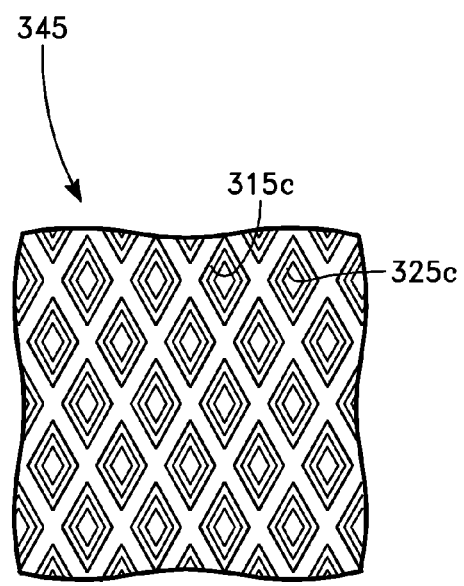

Referring to FIGS. 3A, 3B, and 3C, in some embodiments, the carbon 305c may be removed after the diamond compatible coating 315c has been applied, and the diamond compatible coating 315c optionally may be removed to leave an ordered three-dimensional open-cellular diamond micro-truss structure 335. The diamond compatible coating 315c may be etched with an effective etchant, such as molten salt, under conditions to etch the silicon carbide coating 315c from the coated micro-truss diamond composite structure 325, while leaving the ordered three-dimensional open-cellular diamond micro-truss structure 335. The type of molten salt, the etch temperature, and the etch time is selected by empirical means to completely etch the diamond compatible coating 315c, but minimized etching of the diamond layer 325c.

Referring to FIGS. 3B and D, in other implementations, only the carbon template 305 may be removed leaving the silicon carbide coating 315c to create an ordered bilayered three-dimensional open-cellular diamond micro-truss structure 345. The bilayer may be comprised of an outer diamond layer 325c and an inner silicon carbide (or other diamond compatible material) layer 315c. In various embodiments the diamond layer 325c may have multiple diamond structure types, which may be un-doped and/or doped.

As such, the three-dimensional diamond micro-truss structure may include a network 335 of hollow tubes made of diamond as illustrated in FIG. 3C. The network 335 of hollow tubes may include bi-layer walls of diamond. The network of hollow tubes may further include silicon carbide. Thus, the network of diamond tubes may have a partially filled core. In another embodiment, the diamond tubes have completely filled cores.

The term "an effective etchant" is used herein, is an etchant that is capable of partially etching or completely etching, a compound in question. The effective etchant may be molten salts used alone or in combination and can be selected from the group consisting of potassium hydroxide (KOH), sodium hydroxide (NaOH), potassium nitrate ($KNO_3$), sodium oxide ($Na_2O_2$) and sodium nitrate ($NaNO_3$). Typically, the molten salt is potassium hydroxide.

Thus, in some implementations, the method of FIG. 1 for forming the ordered three-dimensional open cellular diamond micro-truss structure 335 (FIG. 3C) is provided, which may include providing an open-cellular polymer template 100 and converting the polymer template to an vitreous carbon template 110. The method further includes applying a silicon carbide coating to the vitreous carbon template to form a silicon carbide template 120 and depositing a film of diamond on the silicon carbide template to form a silicon carbide-diamond composite structure 130. Further, optionally, the silicon carbide-diamond composite structure may be etched with an effective etchant under conditions to etch the silicon carbide coating to create an ordered three-dimensional diamond micro-truss structure 140, as shown in FIG. 3C. In other implementations, the vitreous carbon structure template and/or the silicon carbide structure template may remain intact.

Typically, the silicon carbide coating is etched out using molten potassium hydroxide (KOH). This method typically yields a lightweight material consisting of network of hollow diamond tubes with interconnected cores.

Figure 5:
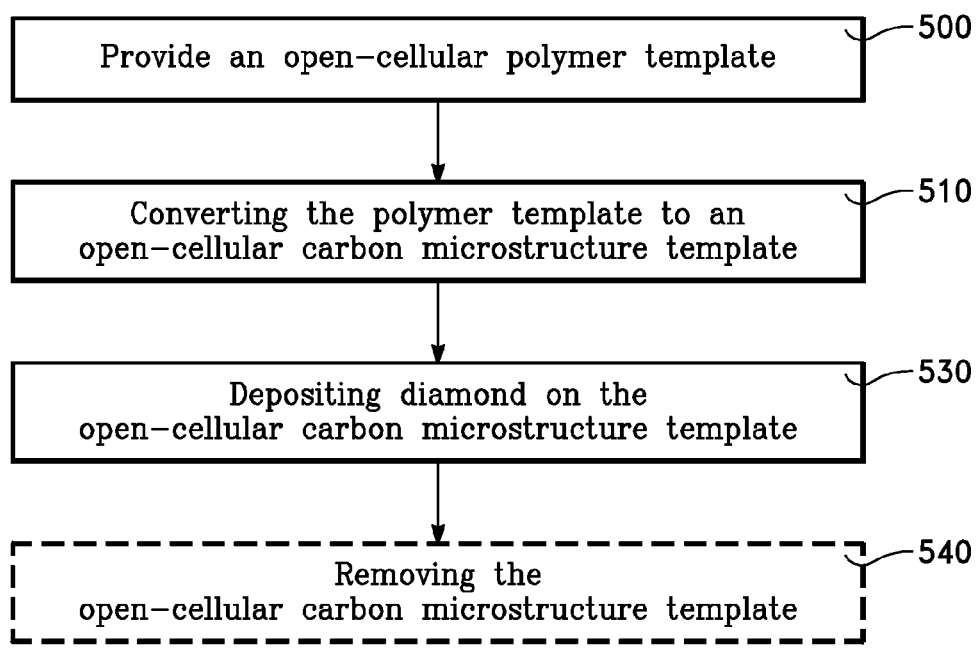
FIG. 5 is a simplified flowchart illustrating a possible implementation for forming an ordered three-dimensional open cellular diamond micro-truss structure.

In yet another implementation of the present invention, the diamond can be grown directly on vitreous carbon via chemical vapor infiltration, eliminating the step of applying a silicon carbide coating to the vitreous carbon template. Thus, referring to FIG. 5, an open-cellular polymer template is provided 500 which is converted into and open-cellular carbon microstructure template 510. A diamond comprising material is deposited on the open-cellular carbon microstructure template 530. Optionally, the open-cellular carbon microstructure template may be removed 540.

The three-dimensional open-cellular carbon micro-truss structure template can be coated by a diamond-compatible coating material selected from the group consisting of refractory metals, ceramics, silicon carbide, silicon nitride, hafnium carbide, chromium carbide, boron nitride, boron carbide, aluminum oxide, titanium diboride, titanium nitride, zirconium dioxide, titanium carbide, titanium carbonitride, tantalum carbide and tantalum nitride. Typically, the material is silicon carbide.

In some embodiments, the diamond compatible coating is deposited directly on the polymer micro-truss 200 (FIG. 2) and the polymer is chemically etched prior to diamond deposition. For example, the diamond compatible coating could be an electroplated metal such as Ni, Cr, Cu, Co, etc., or an electroplated semiconductor such as Si, Ge, GaAs, GaP, InP, InAs, InSb, In2S3, PbS, CdTe, CdSe, ZnSe, ZnTe, ZnCdSe, CdZnTe, CdS, Cu2S, In2Se3, CuInSe2, HgCdTe, etc. Preferably, the electroplated diamond compatible coating is Ni, Cr, Cu, or their alloys. The polymer could be chemically etched in 3M NaOH for 24 hours at 60 degrees Celcius. Thus, referring to FIG. 1, the open-cellular polymer template is provided 100 and the diamond compatible material coating is applied 120 directly onto the open-cellular polymer template. The open-cellular polymer template is removed 125 and then a diamond comprising material is deposited on the diamond compatible material at 130. Optionally, the diamond compatible material coating may be removed 140.

As discussed above, the ordered diamond micro-truss may include bilayer walls of diamond and a material. The material may be selected from the group consisting of refractory metals, ceramics, silicon carbide, silicon nitride, hafnium carbide, chromium carbide, boron nitride, boron carbide, aluminum oxide, titanium diboride, titanium nitride, zirconium dioxide, titanium carbide, titanium carbonitride, tantalum carbide and tantalum nitride. Typically, the material is silicon carbide. Typically, the material 315c is a diamond-compatible coating material which can withstand the conditions of the diamond deposition process and have a coefficient of thermal expansion well matched to diamond 325c.

According to yet other embodiments, the three-dimensional ordered polymer template 200 could be converted to/covered with other materials, which would then serve as the diamond growth template. For example, this may be accomplished by electroplating a diamond compatible coating directly on the open-cellular polymer template 200 (FIG. 2), then etching out the polymer template 200 (FIG. 2) in a dilute base solution (or burning out the polymer template). Alternatively, this may be accomplished by forming an inverse mold of the polymer truss and removing the polymer truss, and then casting (enhanced with high pressure, if desired) a molten metal into the original truss geometry.

Figure 4A:
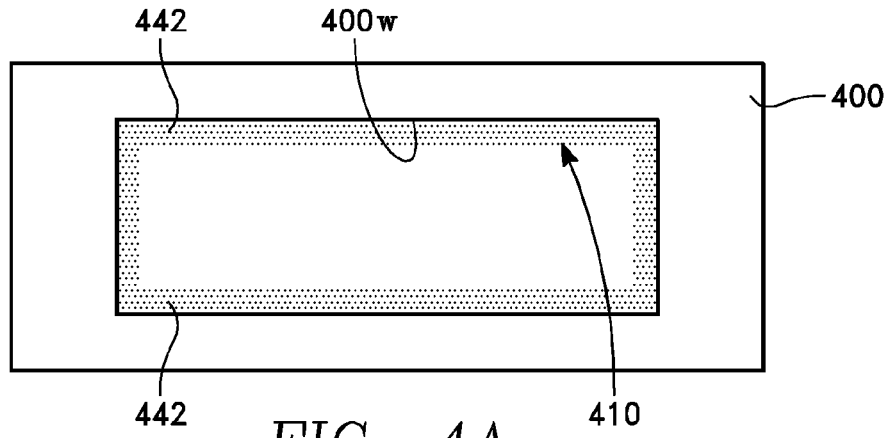
FIGS. 4A-E are simplified illustrations showing a possible implementation for forming a three dimensional ordered diamond cellular structure sandwich panel in accordance with an embodiment of the invention.
Figure 4B:
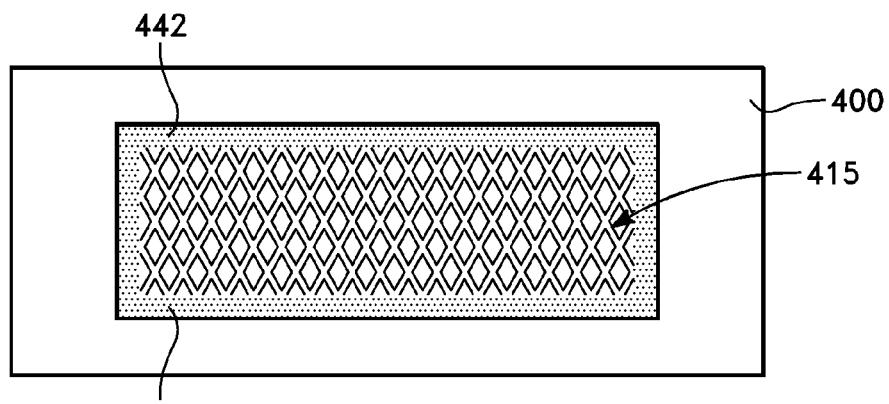
Figure 4C:
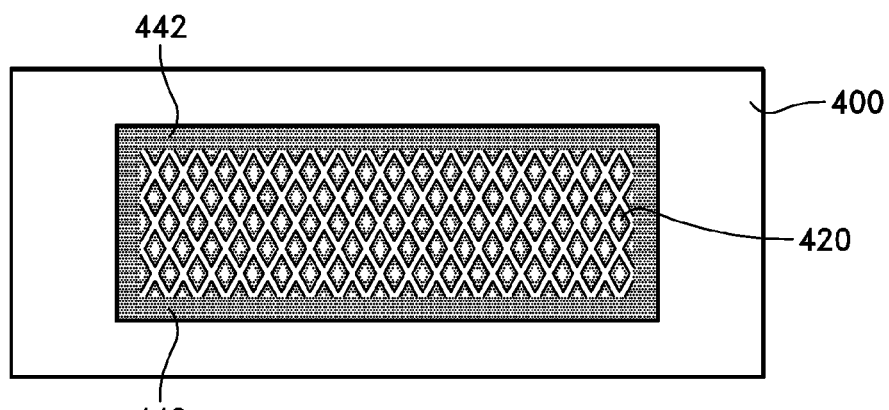
Figure 4D:
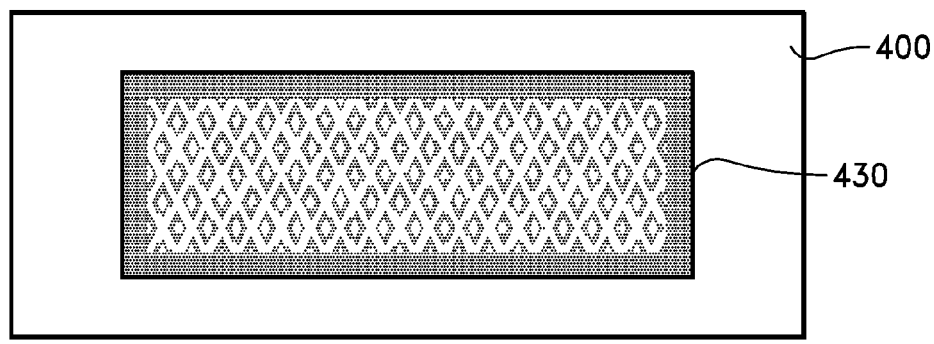
Figure 4E:
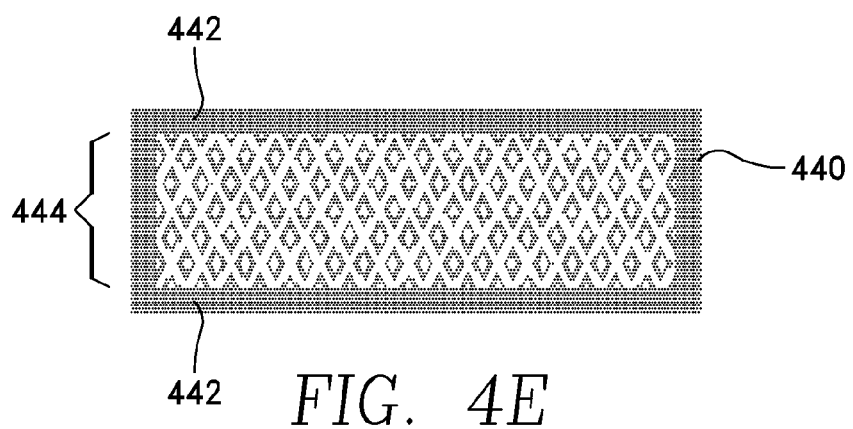

Turning to FIGS. 4A-E, in yet another embodiment a diamond sandwich panel 440 is provided as shown in FIG. 4E. FIGS. 4A-E show one possible implementation of a method for forming a diamond sandwich panel 440. The panel 440 may include two face sheets 442; and a core 444. The core 444 is an ordered three-dimensional open-cellular diamond micro-truss structure. The core 444 is disposed between the two face sheets 442. The face sheets 442 may include diamond. The three-dimensional ordered cellular diamond micro-truss structure 444 may be formed from the interconnected pattern of polymer self-propagating waveguides 200 (FIG. 2).

The method shown in FIGS. 4A-E includes providing a duct mold 400 and depositing diamond 410 on the internal walls 400w of the duct mold 400 to form diamond face sheets 442, shown in FIG. 4A. The implementation of FIGS. 4A-E further includes placing a coated micro-truss composite core structure 415 between the diamond face sheets 442 as shown in FIG. 4B. The micro-truss composite core structure 415 may be a carbon template 305 or a coated template 315 as discussed above with reference to FIGS. 3A & 3B, or other template.

Shown in FIG. 4C, the implementation further includes depositing diamond on the micro-truss composite core structure 415 and mold 400 to form a coated micro-truss composite core structure 420.

In some implementations, the coated micro-truss composite core structure 415 may be placed into the duct mold 400 prior to forming the face sheets 442 so that one or more face sheets may then be formed when depositing diamond on the micro-truss composite core structure 415 and mold 400 to form a diamond coated micro-truss composite core structure 420 within the duct mold 400 as shown in FIG. 4C.

Shown in FIG. 4D, the implementation further includes etching the coated micro-truss composite core structure 420 (FIG. 4C) with an effective etchant under conditions to etch the coating from the coated micro-truss composite core structure 415 (FIG. 4B). The duct mold 400 is removed as shown in FIG. 4E. The etching and removing can occur simultaneously in some implementations.

The coated micro-truss composite core structure 415 may be formed as described above, from an interconnected pattern of self-propagating waveguides as described in Ser. No. 11/580,335, filed on Oct. 13, 2006 entitled OPTICALLY ORIENTED THREE-DIMENSIONAL POLYMER MICROSTRUCTURES, by Jacobsen, issued as U.S. Pat. No. 7,382,959 on Jun. 3, 2008.

The coated micro-truss composite core structure 415 may have a coating made from a material selected from the group consisting of refractory metals, ceramics, silicon carbide, silicon nitride, hafnium carbide, chromium carbide, boron nitride, boron carbide, aluminum oxide, titanium diboride, titanium nitride, zirconium dioxide, titanium carbide, titanium carbonitride, tantalum carbide and tantalum nitride. Typically, the material is silicon carbide. The coated micro-truss composite core structure comprises any material known to those skilled in the art, which can withstand the conditions of the diamond deposition process and a coefficient of thermal expansion well matched to diamond.

Thus, in some embodiments, a silicon carbide micro-truss 415 can be placed inside the diamond 410 deposited in the mold 400.

Typically, the film of diamond is deposited by a gas phase deposition technique selected from one of chemical vapor deposition (CVD), hot wire chemical vapor deposition (HWCVD), plasma enhanced chemical vapor deposition (PECVD) and microwave-assisted chemical vapor deposition.

The diamond may be monocrystalline, polycrystalline, nanocrystalline, or amorphous. Typically, the diamond is polycrystalline.

After depositing diamond on the micro-truss composite core structure 444 and mold 400, a diamond saw can be used to slice off the sides and expose the micro-truss composite core 420 for etching. The coated micro-truss composite core structure 420 may be etched with an effective etchant, such as molten salt, under conditions to etch the coating from the coated micro-truss composite core. Some examples of the molten salts can include potassium hydroxide (KOH), sodium hydroxide (NaOH), potassium nitrate ($KNO_3$), sodium oxide ($Na_2O_2$) and sodium nitrate ($NaNO_3$) and mixtures thereof. Typically, the molten salt is potassium hydroxide.

In some implementations, removing the duct mold 400 and etching the composite core structure 420, can occur simultaneously, depending on the materials.

In some embodiments, etching of micro-truss composite core structure 420 can be omitted, yielding a micro-truss-diamond composite structure.

In yet another embodiment of the present invention, doped diamond films can be used to control the electrical conductivity of the resulting structure.

In yet another embodiment of the present invention, the face sheets can be of a material other than diamond.

In another embodiment of the present invention, the manufacturing process can involve other methods of assembling a sandwich structure. The micro-truss core and face sheets could be fabricated separately and brought together in a final assembly step. Multiple micro-trusses with different geometries could be incorporated into a single sandwich panel core.

In yet another embodiment of the present invention the material in the sandwich panel core could be a random open cell diamond foam.

Additional embodiments include, a composite structure in which the diamond micro-truss open cellular space can be filled with another material, for example, a high tensile-strength polymer. The open cellular space can be filled either partially or completely. The composite structure in which the diamond micro-truss strut cores are filled either partially or completely, with another material.

Furthermore, the various implementations and embodiments discussed herein are suited for making further articles and devices. Devices made from ordered three-dimensional open-cellular diamond micro-truss structure have many applications and distinct advantages in many areas. Various embodiments of the present invention are well suited and directed toward high strength structures that are very lightweight, which may be able to reduce the areal density of space optics, while preserving or increasing the stiffness. By using the superior qualities of diamond, various embodiments of this invention could enable new ultra-lightweight high performance space optics and larger space structures.

In various embodiments, these diamond materials with 3-D ordered micro-truss structures have applications that include but is not limited to, lightweight structural materials (including sandwich panels), energy absorbing materials, heat transfer applications (including heat spreaders, heat pipes, heat exchangers; high-temperature applications such as certain heat pipes and solar thermal power generation which utilize a molten salt as the heat transfer medium), sporting goods equipment (for example, baseball bats, golf clubs, skis), windmill blades (stronger and lighter weight materials enable longer windmill blades which increases power output), prostheses and prosthetic limbs, implants for joint and bone replacement (using exact micro-truss structure to tailor the stiffness to match bone), catalyst support, filtration/separation (especially of highly reactive materials, including molten salts), biological growth templates, flexible body armor/reactive armor, electrical interconnects, wicking materials, functionally graded structures, batteries and fuel cells, deployable structures (space structures), damping structures lightweight armor and space optics (beryllium replacement).

The various previously described embodiments have many advantages. By utilizing the superior properties of diamond, these advantages may include providing diamond materials with ordered interconnected three-dimensional micro-truss structures that are ultra-lightweight, highly durable, hard materials, which can withstand a high temperature, oxidizing environment. Further, these free-standing ordered diamond micro-truss structures would use the minimum amount of diamond so that large-scale diamond structures can be fabricated. In particular, by conversion of scalable, net-shape, mechanically-efficient micro-architected truss structures to these structures with diamond, various embodiments offer a number of advantages in comparison to conventional random foam structures (where performance typically may not be optimized). In addition, the versatility, the cost effectiveness, and the applications for use in aerospace optics, make various structures and methods of embodiments of the invention especially valuable. Further, by using diamond to replace beryllium, safer workplace environments would be available, which could reduce associated precautionary costs.

It is worthy to note that any reference to "one embodiment" or "an embodiment" means that a particular feature, structure, or characteristic described in connection with the embodiment may be included in an embodiment, if desired. The appearances of the phrase "in one embodiment" in various places in the specification are not necessarily all referring to the same embodiment.

The illustrations and examples provided herein are for explanatory purposes and are not intended to limit the scope of the appended claims. This disclosure is to be considered an exemplification of the principles of the invention and is not intended to limit the spirit and scope of the invention and/or claims of the embodiment illustrated.

Those skilled in the art will make modifications to the invention for particular applications of the invention.

The discussion included in this patent is intended to serve as a basic description. The reader should be aware that the specific discussion may not explicitly describe all embodiments possible and alternatives are implicit. Also, this discussion may not fully explain the generic nature of the invention and may not explicitly show how each feature or element can actually be representative or equivalent elements. Again, these are implicitly included in this disclosure. Where the invention is described in device-oriented terminology, each element of the device implicitly performs a function. It should also be understood that a variety of changes may be made without departing from the essence of the invention. Such changes are also implicitly included in the description. These changes still fall within the scope of this invention.

Further, each of the various elements of the invention and claims may also be achieved in a variety of manners. This disclosure should be understood to encompass each such variation, be it a variation of any apparatus embodiment, a method embodiment, or even merely a variation of any element of these. Particularly, it should be understood that as the disclosure relates to elements of the invention, the words for each element may be expressed by equivalent apparatus terms even if only the function or result is the same. Such equivalent, broader, or even more generic terms should be considered to be encompassed in the description of each element or action. Such terms can be substituted where desired to make explicit the implicitly broad coverage to which this invention is entitled. It should be understood that all actions may be expressed as a means for taking that action or as an element which causes that action. Similarly, each physical element disclosed should be understood to encompass a disclosure of the action which that physical element facilitates. Such changes and alternative terms are to be understood to be explicitly included in the description.

While the present invention has been described in connection with certain exemplary embodiments, it is to be understood that the invention is not limited to the disclosed embodiments, on the contrary, it is intended to cover various modifications and equivalent arrangements included within the spirit and scope of the appended claims, and equivalents thereof.

What is claimed is:

1. A three-dimensional micro-truss structure comprising an interconnected ordered network of interpenetrating diamond tubes, wherein the ordered network comprises a plurality of first diamond tubes defined by a plurality of first self-propagating polymer waveguides extending along a first direction, a plurality of second diamond tubes defined by a plurality of second self-propagating polymer waveguides extending along a second direction, and a plurality of third diamond tubes defined by a plurality of third self-propagating polymer waveguides extending along a third direction, wherein the first, second, and third micro-truss diamond tubes interpenetrate each other at a plurality of nodes to form a continuous material, wherein the interconnected network of interpenetrating diamond tubes comprises an ordered diamond micro-truss network comprising a network of hollow tubes comprising diamond, and wherein the hollow tubes comprise bilayer walls comprising diamond and a material comprising at least one of: refractory metals, ceramics, silicon carbide, silicon nitride, hafnium carbide, chromium carbide, boron nitride, boron carbide, aluminum oxide, titanium diboride, titanium nitride, zirconium dioxide, titanium carbide, titanium carbonitride, tantalum carbide, tantalum nitride, or combinations thereof.

2. The three-dimensional micro-truss structure of claim 1, wherein the interconnected ordered network of interpenetrating diamond tubes are formed from a template comprising a plurality of microtruss struts interpenetrating each other at a plurality of nodes to form a continuous material.

3. The three-dimensional micro-truss structure of claim 2, wherein the interconnected ordered network of interpenetrating diamond tubes comprise an image of a polymer template comprised of an interconnected pattern of self-propagating waveguides.

4. The three-dimensional micro-truss structure of claim 1, wherein the interconnected ordered network of interpenetrating diamond tubes comprise an image of a polymer template comprised of an interconnected pattern of self-propagating waveguides.

5. The three-dimensional micro-truss structure of claim 1, wherein the material comprises ceramic.

6. The three-dimensional micro-truss structure of claim 1, wherein the material comprises silicon nitride.

7. The three-dimensional micro-truss structure of claim 1, wherein the material comprises titanium nitride.

8. The three-dimensional micro-truss structure of claim 1, wherein the material comprises titanium carbide.

9. The three-dimensional micro-truss structure of claim 1, wherein the material comprises a refractory metal.

10. A three-dimensional micro-truss structure comprising an interconnected ordered network of interpenetrating diamond tubes, wherein the ordered network comprises a plurality of first diamond tubes defined by a plurality of first self-propagating polymer waveguides extending along a first direction, a plurality of second diamond tubes defined by a plurality of second self-propagating polymer waveguides extending along a second direction, and a plurality of third diamond tubes defined by a plurality of third self-propagating polymer waveguides extending along a third direction, wherein the first, second, and third micro-truss diamond tubes interpenetrate each other at a plurality of nodes to form a continuous material, wherein the interconnected network of interpenetrating diamond tubes comprises an ordered diamond micro-truss network comprising a network of hollow tubes comprising diamond, and wherein the hollow tubes comprise bilayer walls comprising diamond, and wherein the bilayer walls comprise Ni, Cr, Cu, or alloys thereof.

11. A diamond sandwich panel, the panel comprising:
a) two face sheets; and
b) a core comprising an ordered three-dimensional open-cellular diamond micro-truss structure disposed between the two face sheets, wherein the ordered three-dimensional open-cellular diamond micro-truss structure comprises interconnected network of interpenetrating micro-truss, wherein the ordered network comprises a plurality of first diamond tubes defined by a plurality of first self-propagating diamond waveguides extending along a first direction, a plurality of second diamond tubes defined by a plurality of second self-propagating diamond waveguides extending along a second direction, and a plurality of third diamond tubes defined by a plurality of third self-propagating diamond waveguides extending along a third direction, wherein the first, second, and third micro-truss diamond tubes interpenetrate each other at a plurality of nodes to form a continuous material, wherein the three-dimensional ordered cellular diamond micro-truss structure comprises a network of hollow tubes comprising diamond, and wherein the hollow tubes comprise bilayer walls of diamond and a material comprising at least one of: refractory metals, ceramics, silicon carbide, silicon nitride, hafnium carbide, chromium carbide, boron nitride, boron carbide, aluminum oxide, titanium diboride, titanium nitride, zirconium dioxide, titanium carbide, titanium carbonitride, tantalum carbide, tantalum nitride, or combinations thereof.

12. The diamond sandwich panel structure of claim 11, wherein the face sheets comprise diamond.

13. The diamond sandwich panel structure of claim 11, wherein the three-dimensional ordered cellular diamond micro-truss structure comprises an interconnected pattern of polymer self-propagating waveguides.

\* \* \* \* \*